United States Patent
Lipincott et al.

(10) Patent No.: US 8,191,017 B2
(45) Date of Patent: May 29, 2012

(54) SITE SELECTIVE OPTICAL PROXIMITY CORRECTION

(75) Inventors: George P. Lipincott, Lake Oswego, OR (US); Christopher E. Reid, Tigard, OR (US)

(73) Assignee: Mentor Graphics Corp., Wilsonville, OR (US)

( * ) Notice: Subject to any disclaimer, the term of this patent is extended or adjusted under 35 U.S.C. 154(b) by 425 days.

(21) Appl. No.: 12/353,834

(22) Filed: Jan. 14, 2009

(65) Prior Publication Data

US 2009/0241077 A1    Sep. 24, 2009

Related U.S. Application Data

(60) Provisional application No. 61/020,952, filed on Jan. 14, 2008.

(51) Int. Cl.
*G06F 17/50* (2006.01)

(52) U.S. Cl. .................. 716/53; 716/52; 430/5

(58) Field of Classification Search ............ 716/52, 716/53; 430/5
See application file for complete search history.

(56) References Cited

U.S. PATENT DOCUMENTS

| | | | |
|---|---|---|---|
| 6,249,904 B1 * | 6/2001 | Cobb | 716/53 |
| 6,467,076 B1 * | 10/2002 | Cobb | 716/53 |
| 7,024,655 B2 * | 4/2006 | Cobb | 716/52 |
| 2009/0077519 A1 * | 3/2009 | Hong | 716/11 |

* cited by examiner

*Primary Examiner* — Naum Levin

(74) *Attorney, Agent, or Firm* — Mentor Graphics Corp.

(57) ABSTRACT

Techniques for performing optical proximity correction on a layout design or portion thereof are provided with various implementations of the invention. With various implementations of the invention, movement and simulation of selected edge fragments is disabled during the optical proximity correction process. The operations of the optical proximity correction process, such as for example simulation and displacement of edge segments, is then performed for the edge fragments that remain enabled. With further implementations of the invention, a simulation site is defined for ones of the edge fragments. The operations of the optical proximity correction process, such as for example simulation and displacement of edge segments, is performed for each simulation site. Additionally, during the optical proximity correction process, the simulations sites may be moved and or removed individually based on various conditions.

9 Claims, 10 Drawing Sheets

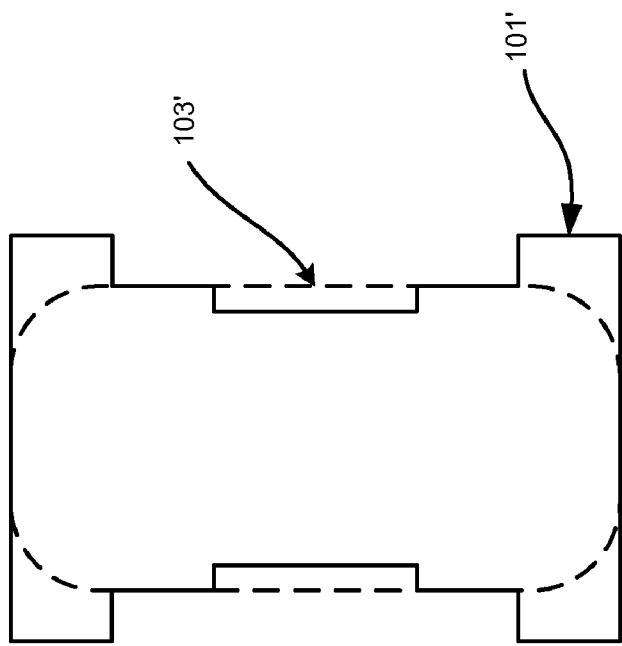
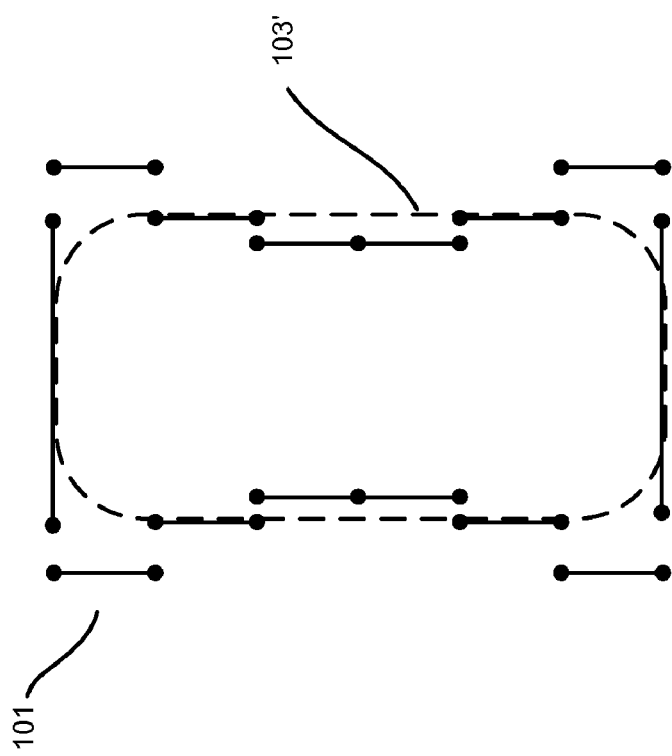

SITE SELECTIVE OPTICAL PROXIMITY CORRECTION

RELATED APPLICATIONS

This application claims priority under 35 U.S.C. § 119(e) to U.S. Provisional Patent Application No. 61/020,952 entitled "Optical Proximity Correction Iteration," filed on Jan. 14, 2008, and naming George Lippincott et al. as inventors, which application is incorporated entirely herein by reference.

FIELD OF THE INVENTION

The invention relates to the field of photolithographic processing. More particularly, various aspects of the invention relate to reducing the number of iterations required for performing optical proximity correction (OPC) on microcircuit layout designs.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

IC layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacturer the device using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask based upon the layout design data, after which the mask can be used in a photolithographic process. The image created in the mask is often referred to as the intended or target image, while the image created on the substrate, by employing the mask in the photolithographic process is referred to as the printed image.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the layout design onto the substrate. Adding to the difficulty associated with increasingly smaller feature size is the diffractive effects of light. As light illuminates the mask, the transmitted light diffracts at different angles in different regions of the mask. These effects often result in defects where the intended image is not accurately "printed" onto the substrate during the photolithographic process, creating flaws in the manufactured device.

To address this problem, one or more resolution enhancement techniques are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, *Proceedings of SPIE Vol.* 5377, which article is incorporated entirely herein by reference. One of these techniques, radiation amplitude control, is often facilitated by modifying the layout design data employed to create the lithographic mask. One way to implement this technique, for example, is to adjust the edges of the geometric elements in the layout design so that the mask created from the modified layout data will control the radiation amplitude in a desired way during a lithographic process. The process of modifying the layout design data in this manner is often referred to as "optical proximity correction" or "optical process correction" (OPC).

As previously noted, a layout design is made up of a variety of geometric elements, which typically are polygons. In a conventional optical proximity correction process, the edges of these polygons are fragmented. More particularly, the individual edges of each polygon are divided into smaller sections, often referred to as edge segments or edge fragments. The size of the fragments and which particular edges are to be fragmented is dependent upon parameters of the optical proximity correction process. The fragmenting of edges facilitates the optical proximity correction process by allowing the edge segments to be rearranged or edited to realize the desired modifications. Additionally, geometric features that will increase the fidelity of the photolithographic process may be added to the design by moving or displacing the fragments. For example, some optical proximity correction processes will reconfigure the edge segments of a polygon to create serifs at one or more corners.

Optical proximity correction is an iterative process. That is, the lithographic process that will be used to manufacture the integrated circuit is simulated to determine if the simulated printed image matches the intended printed image. Modifications are made to the layout design based upon the simulation results, and the lithographic process is simulated again. When the simulated printed image cannot be substantially improved by further displacement of the edge segments, it is often said that the optical proximity correction process has converged. This process of simulation, modification, and simulation is repeated until the simulated printed image significantly corresponds to the intended printed image, or until the optical proximity correction process has converged.

Layout designs can be very large. For example, one layout data file for a single layer of a field programmable gate array may be approximately 58 gigabytes. Accordingly, performing even a single iteration of an optical proximity correction process on a design is computationally intensive. Repeating the optical proximity correction process until the simulated printed image matches the intended printed image, or until the optical proximity correction process has converged, only adds to the time required to finalize the layout design. Often, it can take as many as eight or more iterations for an optical proximity correction process to converge. Due to the number of required iterations of optical proximity correction and the complexity and size of modern layout designs, the time required to perform optical proximity correction is often measured in days. Even where advanced computer processing techniques are employed, performing optical proximity correction may still take days.

SUMMARY OF THE INVENTION

Various implementations of the invention provide methods and apparatuses for performing optical proximity correction on a layout design or portion thereof. In various implementations of the invention, movement and simulation of selected edge fragments is disabled during the optical proximity correction process. The operations of the optical proximity correction process, such as for example simulation and displacement of edge segments, is then performed for the edge fragments that remain enabled. With further implementations of the invention, a simulation site is defined for ones of the edge fragments. The operations of the optical proximity correction process, such as for example simulation and displacement of edge segments, is performed for each simulation site. Additionally, during the optical proximity correction process, the simulations sites may be moved and or removed individually based on various conditions.

These and additional aspects of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which:

FIG. 3B illustrates the layout design feature of FIG. 1, modified by an optical proximity correction process;

FIG. 3C illustrates the layout design feature of FIG. 3B, shown in further detail;

DETAILED DESCRIPTION OF ILLUSTRATIVE IMPLEMENTATIONS

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" to describe the disclosed methods. Such terms are high-level abstractions of the actual operations that are performed. The actual operations that correspond to these terms will vary depending on the particular implementation and are readily discernible by one of ordinary skill in the art.

Some of the methods described herein can be implemented by software stored on a computer readable storage medium, or executed on a computer. Additionally, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Optical Proximity Correction

In a photolithographic process, as explained above, electromagnetic radiation is transmitted through selectively transparent areas of a mask. The radiation passing through these transparent areas then irradiates desired portions of a photoresistive material on a layer of semiconductor substrate. The mask in turn is created from layout design data describing the geometric features that should be manufactured on the semiconductor substrate, by way of the photolithographic process, in order to create the desired circuit. For example, if a transistor should have a rectangular gate region, then the layout design data will include a rectangle defining that gate region. This rectangle in the layout design data is then implemented in a mask for "printing" the rectangular gate region onto the substrate.

Figure 1:
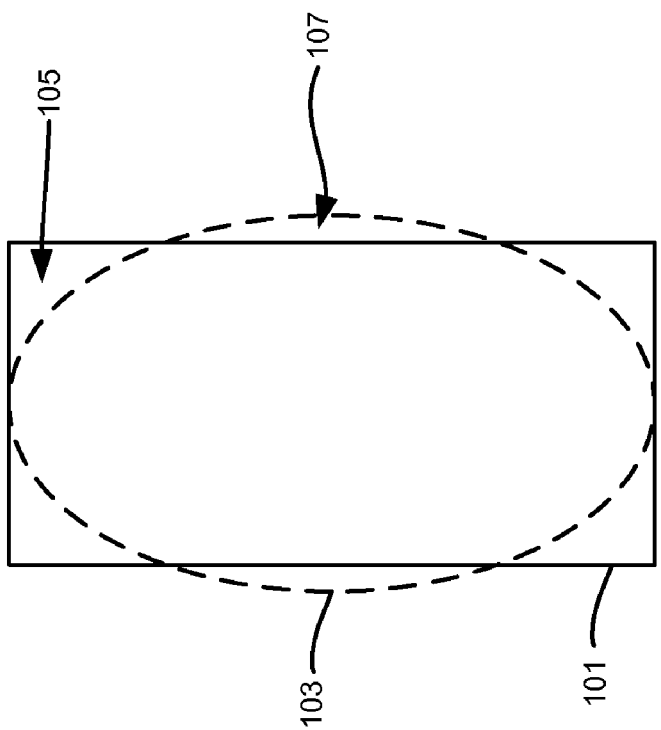
FIG. 1 illustrates a layout design feature.

During a photolithographic process, however, optical effects will prevent the shapes defined by the mask from being faithfully imaged onto the substrate. Diffractive effects for example, may distort the image produced by a mask. Moreover, these distortions become more pronounced as the images produced by the mask become smaller relative to the wavelength of radiation used in the photolithographic process. Thus, a photolithographic process seeking to reproduce the rectangular mask feature 101 illustrated in FIG. 1, may only produce the image 103. As seen in this figure, the image 103 is substantially narrower in the corners (e.g., corner 105) than the ideal rectangular shape intended by the mask feature 101. Likewise, the image 103 may have areas (e.g., 107) that extend beyond the ideal rectangular shape intended by the mask feature 101. The intended shape or feature, which may correspond to the mask features shown in FIG. 1, is often referred to as the target shape or the target image. The image created by employing the mask in a photolithographic process, such as for example the image 103, is often then referred to as the printed image.

Figure 2:
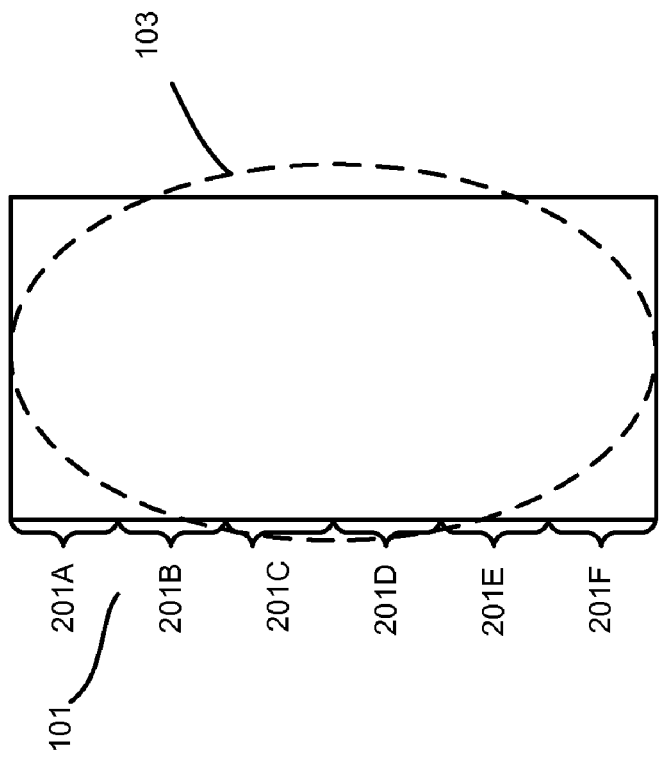
FIG. 2 illustrates the layout design feature of FIG. 1, shown in Further detail.

To correct for these optical distortions, many circuit designers will attempt to modify the layout design data, producing modified mask features, to enhance the resolution of the images that will be produced by the modified mask during the photolithographic process. Thus, some designers will employ an optical proximity correction (OPC) process on the layout design data, in an effort to better control the amplitude and/or phase of the radiation transmitted by the mask at specific locations. In a typical optical proximity correction process, the edges of the geometric elements in the design are fragmented. For example, as shown in FIG. 2, an edge of the rectangular mask feature 101, which may be used to create the image 103, is fragmented into edge segments 201A-201F. The partitioning of edge segments within a given layout design depends upon the specific optical proximity correction process parameters, often referred to as the optical proximity correction "recipe." The recipe specifies, among other factors, the size of the edge segments. Accordingly, not all edges within a layout design will be fragmented in every optical proximity correction process. Additionally, the size of the edge segments resulting from fragmenting the polygon edges within a layout design can vary depending upon the layout design, the optical proximity correction process, or the optical proximity correction process recipe.

Figure 3A:
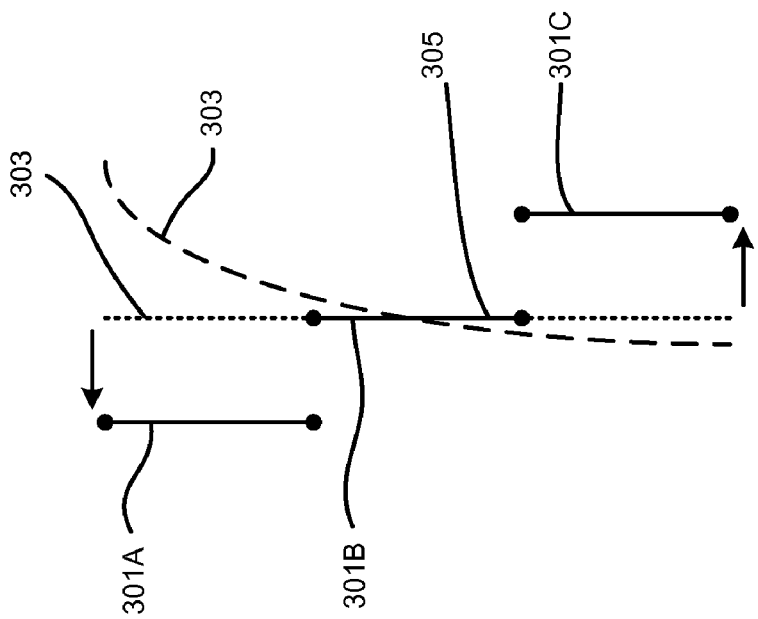
FIG. 3A illustrates the target layout design feature portion and the associated simulated printed image of FIG. 3, shown in further detail.
Figure 3:
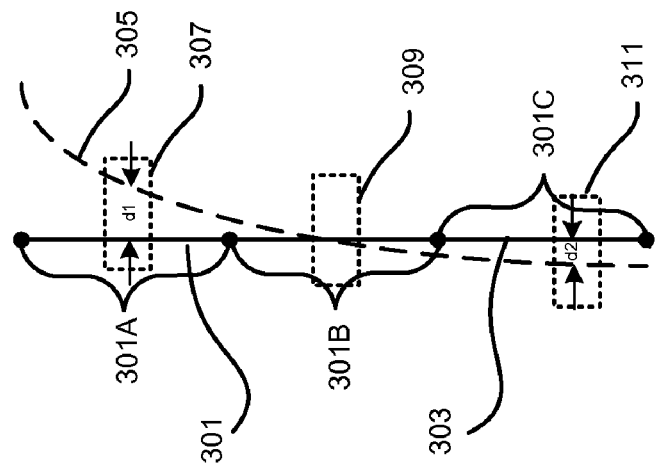
FIG. 3 illustrates a portion of a target layout design feature and an associated simulated printed image.

In attempting to correct for optical distortions within the photolithographic process, the optical proximity correction process simulates the printed image. That is, the photolithographic process is simulated in order to produce a simulated printed image. FIG. 3 illustrates a mask feature 301, a target image 303, and a simulated printed image 305. The simulated image 305 is compared to the target image 303. Typically, this comparison is done at each edge segment. For example, as shown in FIG. 3, the target image 303 is a distance d1 away from the simulated printed image 305 at the edge segment 301A, the target image 303 is a distance d2 away from the simulated printed image 305 at the edge segment 301C, while the target image 303 intersects the simulated printed image 305 at the edge segment 301B. The distances between the target image 303 and the simulated printed image 305 are often referred to as the edge placement error (EPE). Accordingly, in a typical optical proximity correction process, each edge segment, as well as each un-fragmented edge, will have an associated edge placement error. The location where the edge placement error is computed is often referred to as a simulation site. For example, FIG. 3 illustrates the simulation sites 307-311. In conventional optical proximity correction processes, the location of simulation sites does not change during the optical proximity correction process.

Following simulation and calculation of the edge placement error, the edge segments are individually moved in order to improve the resolution of the simulated printed image for the resulting mask. For example, as shown in FIG. 3A, the edge segment 301A is displaced in a direction away from the target image 303, in an effort to widen the corresponding portion of the image that would be produced by the resulting mask at the location of the edge segment 301A. Similarly, the edge segment 301C is displaced in a direction away from the target image 303, in an effort to narrow the corresponding portion of the image that would produced by the resulting mask at the location of the edge segment 301C.

This process of simulating the image that would be produced using the mask feature, comparing the simulated image to the target image, and moving edge segments accordingly may be repeated a number of times. Each cycle of simulation, compare, and move is referred to as an iteration of the optical proximity correction process. Typically, selecting edge segments to be moved during a given iteration, and the distance the edge segments are displaced, are determined based upon the edge placement errors for the edge fragment and the optical proximity correction process recipe. For example, an optical proximity correction process may move an edge segment some factor of the edge placement error for that edge fragment away from the simulated printed image or the target image. Additionally, each edge segment may be displaced the same distance during a given iteration. The specific parameters that control edge movement are dependent upon the tool used to implement the optical proximity correction process and the optical proximity correction process recipe.

Typically, the optical proximity correction process is allowed to iterate until the simulated image is sufficiently similar to the target image (e.g., both d1 and d2 are smaller than a threshold value), or until it is determined that the edge segments have converged on locations where no further movement of the edge segments will improve the simulated image. FIG. 3B shows the rectangular mask feature 101 of FIG. 1, with the edges fragmented and displaced, along with a simulated printed image 103' based upon the displaced edge segments. Once the final positions of the edge segments are determined in the layout design data as shown in FIG. 3B, a modified mask feature can be created from the corrected layout design data. FIG. 3C shows a modified mask feature 101', produced from the displaced edge segments of FIG. 3B. Additionally, the image 103' produced by the modified mask feature 101' is shown. FIG. 3C illustrates that the modified mask feature 101' produces an image that more closely correspond to the target image.

Illustrative Computing Environment

Various embodiments of the invention are implemented using computer executable software instructions executed by one or more programmable computing devices. Because these examples of the invention may be implemented using software instructions, the components and operation of a generic programmable computer system on which various embodiments of the invention may be employed is described. Further, because of the complexity of some electronic design automation processes and the large size of many circuit designs, various electronic design automation tools are configured to operate on a computing system capable of simultaneously running multiple processing threads. The components and operation of a computer network 401 having a host or master computer and one or more remote or slave computers therefore will be described with reference to FIG. 4. This operating environment is only one example of a suitable operating environment, however, and is not intended to suggest any limitation as to the scope of use or functionality of the invention.

Figure 4:
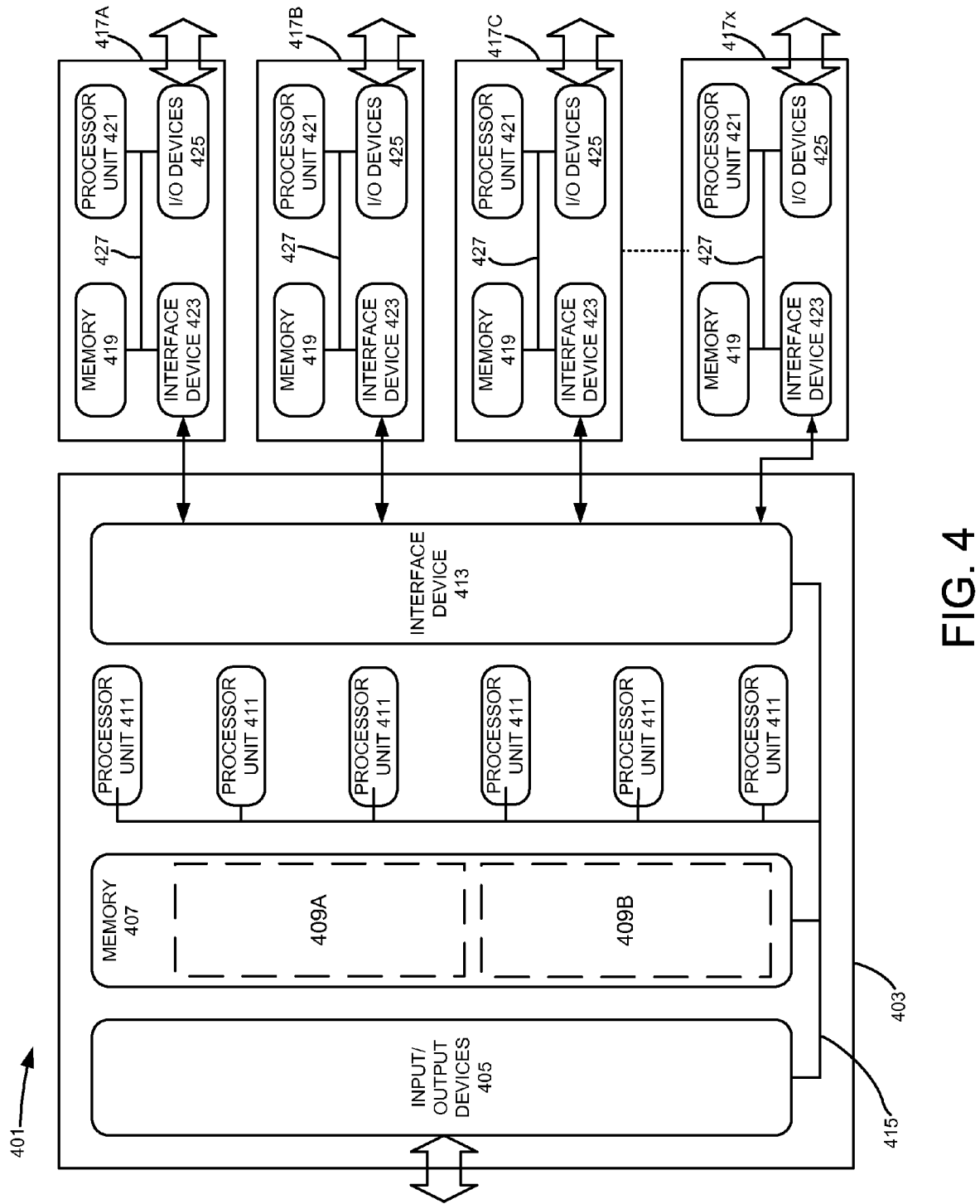
FIG. 4 illustrates an illustrative computing environment.

In FIG. 4, the computer network 401 includes a master computer 403. In the illustrated example, the master computer 403 is a multi-processor computer that includes a plurality of input and output devices 405 and a memory 407. The input and output devices 405 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 407 may similarly be implemented using any combination of computer readable media that can be accessed by the master computer 403. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 403 runs a software application for performing one or more operations according to various examples of the invention. Accordingly, the memory 407 stores software instructions 409A that, when executed, will implement a software application for performing one or more operations. The memory 407 also stores data 409B to be used with the software application. In the illustrated embodiment, the data 409B contains process data that the software application uses to perform the operations, at least some of which may be parallel.

The master computer 403 also includes a plurality of processor units 411 and an interface device 413. The processor units 411 may be any type of processor device that can be programmed to execute the software instructions 409A, but will conventionally be a microprocessor device. For example, one or more of the processor units 411 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 411 may be a custom manufactured processor, such as a microprocessor designed to optimally perform specific types of mathematical operations. The interface device 413, the processor units 411, the memory 407 and the input/output devices 405 are connected together by a bus 415.

Figure 5:
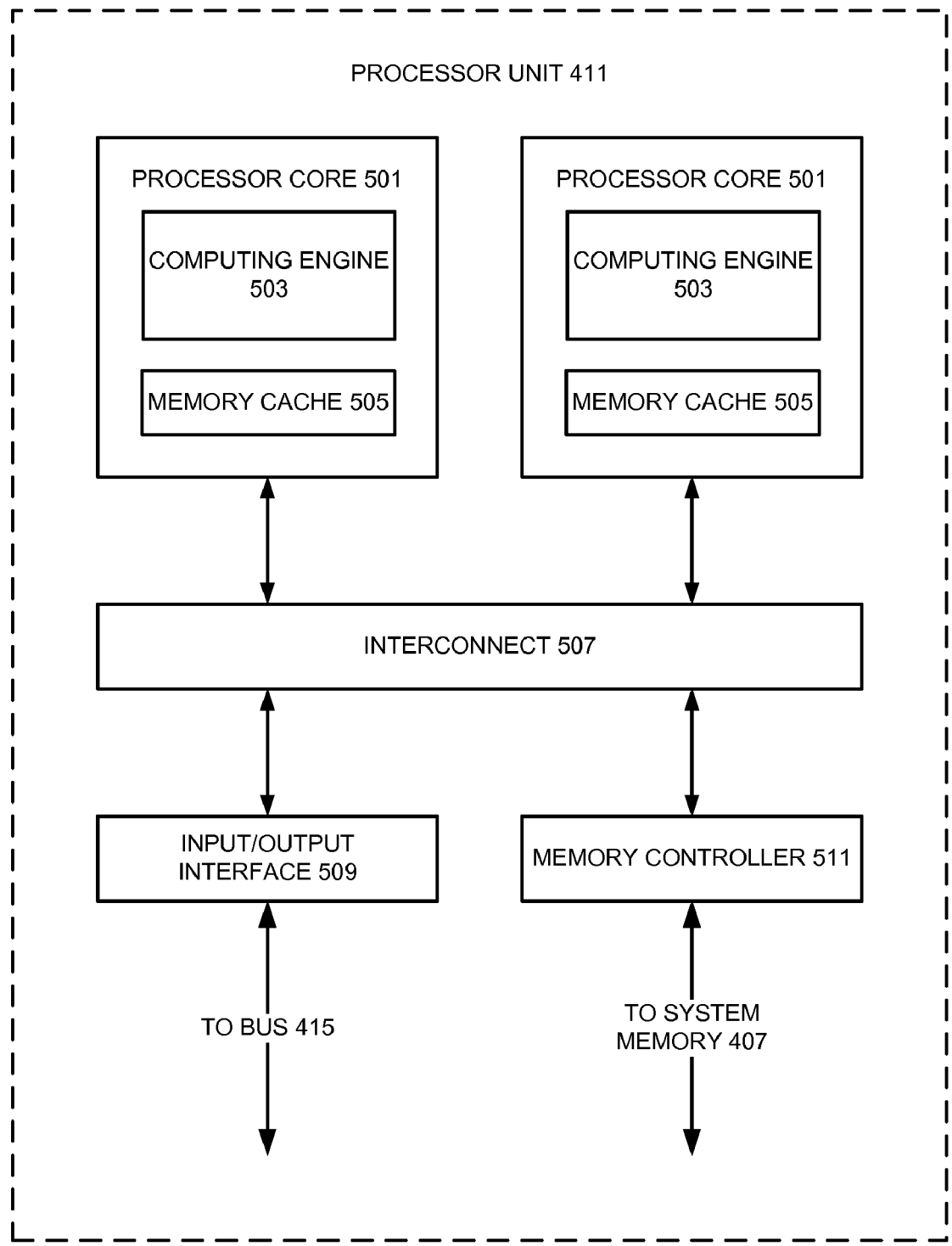
FIG. 5 illustrates a portion of the illustrative computing environment of FIG. 4, shown in further detail.

With some implementations of the invention, the master computing device 403 may employ one or more processing units 411 having more than one processor core. Accordingly, FIG. 5 illustrates an example of a multi-core processor unit 411 that may be employed with various embodiments of the invention. As seen in this figure, the processor unit 411 includes a plurality of processor cores 501. Each processor core 501 includes a computing engine 503 and a memory cache 505. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 503 may then use its corresponding memory cache 505 to quickly store and retrieve data and/or instructions for execution.

Each processor core 501 is connected to an interconnect 507. The particular construction of the interconnect 507 may vary depending upon the architecture of the processor unit 501. With some processor cores 501, such as the Cell microprocessor created by Sony Corporation, Toshiba Corporation and IBM Corporation, the interconnect 507 may be implemented as an interconnect bus. With other processor cores 501, however, such as the Opteron™ and Athlon™ dual-core processors available from Advanced Micro Devices of Sunnyvale, Calif., the interconnect 507 may be implemented as a system request interface device. In any case, the processor cores 501 communicate through the interconnect 507 with an input/output interfaces 509 and a memory controller 511. The input/output interface 509 provides a communication interface between the processor unit 411 and the bus 415. Similarly, the memory controller 511 controls the exchange of information between the processor unit 411 and the system memory 407. With some implementations of the invention, the processor units 411 may include additional components, such as a high-level cache memory accessible shared by the processor cores 501.

While FIG. 5 shows one illustration of a processor unit 411 that may be employed by some embodiments of the invention, it should be appreciated that this illustration is representative only, and is not intended to be limiting. For example, some embodiments of the invention may employ a master computer 403 with one or more Cell processors. The Cell processor employs multiple input/output interfaces 509 and multiple memory controllers 511. Also, the Cell processor has nine different processor cores 501 of different types. More particularly, it has six or more synergistic processor elements (SPEs) and a power processor element (PPE). Each synergistic processor element has a vector-type computing engine 403 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 411 can be used in lieu of multiple, separate processor units 411. For example, rather than employing six separate processor units 411, an alternate implementation of the invention may employ a single processor unit 411 having six cores, two multi-core processor units 411 each having three cores, a multi-core processor unit 411 with four cores together with two separate single-core processor units 411, or other desired configuration.

Returning now to FIG. 4, the interface device 413 allows the master computer 403 to communicate with the slave computers 417A, 417B, 417C . . . 417x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 413 translates data and control signals from the master computer 403 and each of the slave computers 417 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 417 may include a memory 419, a processor unit 421, an interface device 423, and, optionally, one more input/output devices 425 connected together by a system bus 427. As with the master computer 403, the optional input/output devices 425 for the slave computers 417 may include any conventional input or output devices, such as keyboards, pointing devices, microphones, display monitors, speakers, and printers. Similarly, the processor units 421 may be any type of conventional or custom-manufactured programmable processor device. For example, one or more of the processor units 421 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 421 may be custom manufactured processors, such as microprocessors designed to optimally perform specific types of mathematical operations. Still further, one or more of the processor units 421 may have more than one core, as described with reference to FIG. 5 above. For example, with some implementations of the invention, one or more of the processor units 421 may be a Cell processor. The memory 419 then may be implemented using any combination of the computer readable media discussed above. Like the interface device 413, the interface devices 423 allow the slave computers 417 to communicate with the master computer 403 over the communication interface.

In the illustrated example, the master computer 403 is a multi-processor unit computer with multiple processor units 411, while each slave computer 417 has a single processor unit 421. It should be noted, however, that alternate implementations of the invention may employ a master computer having single processor unit 411. Further, one or more of the slave computers 417 may have multiple processor units 421, depending upon their intended use, as previously discussed. Also, while only a single interface device 413 or 423 is illustrated for both the master computer 403 and the slave computers 417, it should be, noted that, with alternate embodiments of the invention, either the master computer 403, one or more of the slave computers 417, or some combination of both may use two or more different interface devices 413 or 423 for communicating over multiple communication interfaces.

With various examples of the invention, the master computer 403 may be connected to one or more external data storage devices. These external data storage devices may be implemented using any combination of computer readable media that can be accessed by the master computer 403. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the slave computers 417 may alternately or additions be connected to one or more external data storage devices. Typically, these external data storage devices will include data storage devices that also are connected to the master computer 403, but they also may be different from any data storage devices accessible by the master computer 403.

It also should be appreciated that the description of the computer network illustrated in FIG. 4 and FIG. 5 is provided as an example only and is not intended to suggest any limitation as to the scope of use or functionality of alternate embodiments of the invention.

Site Selective Optical Proximity Correction

As described in detail above, optical proximity correction is an iterative process whereby edges in a layout design are partitioned into edge segments and the edge segments are displaced. As the specifics of optical proximity correction have already been discussed in detail above, the detailed implementations of the particular optical proximity correction processes employed by various implementations of the invention have often been omitted from the balance of this disclosure. Instead, general operations germane to an optical proximity correction process, for example, edge segment, displacement, iteration, or convergence are used to describe the optical proximity correction operations implemented with various embodiments of the present invention. These abstract descriptions are to be interpreted in light of the above description of optical proximity correction and the accompanying figures, as well as the knowledge possessed by those of ordinary skill in the art related to optical proximity correction and photolithography.

In a typical optical proximity correction process, the number of iterations required for the process to converge on a suitable solution may be eight to ten iterations or more, depending upon the layout design and the optical proximity correction recipe. Even with advanced computing resources, sophisticated optical proximity correction tools, and good recipes, the time needed to perform eight to ten iterations is typically a few days. One reason for the high number of required iterations is due to fragments oscillating around a final target. Without carefully designed feedback processes individual to a particular layout design, edge segments will typically oscillate around the final target further adding to the number of iterations required for the process to converge. Another reason that the number of required iterations is high is due to the differing speed with which different types of edge segments converge. For example, with some layout designs the short edge segments forming the end edge between two longer edges (typically called line end fragments) converge much slower than other types of edge segments within the layout design do. Additionally, due to the complexity and size of modern designs, a large number of edge fragments and accordingly, simulation sites must be processed during each of the iterations of an optical proximity correction process. As a result, a significant amount of computing resources is required to process the large number of edge fragments and simulation sites.

Site Selective Optical Proximity Correction Overview

Figure 6A:
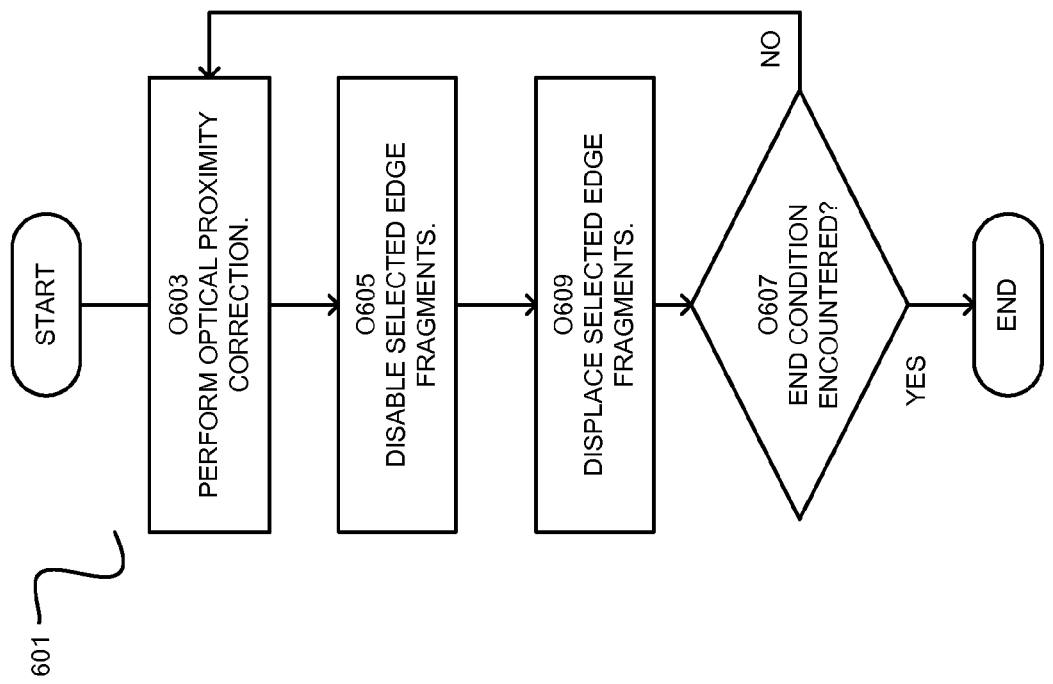
FIG. 6A illustrates an alternate implementation of the method shown in FIG. 6.
Figure 6:
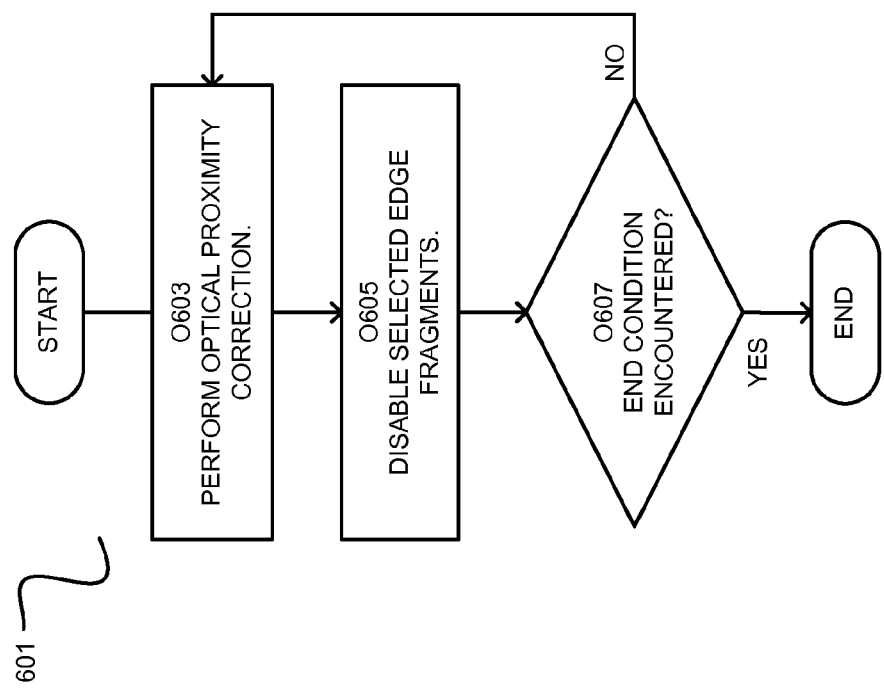
FIG. 6 illustrates a method of modifying a layout design.

FIG. 6 illustrates a method 601 for adjusting a layout design for a mask according to various implementations of the invention. The method 601 includes an operation 603 for performing optical proximity correction on a layout design and an operation 605 for disabling selected edge fragments within the layout design. The method 601 additionally includes an operation 607 for performing multiple iterations of the method 601.

In various implementations of the invention, the operation 603 may perform a single iteration of optical proximity correction on a portion of a layout design for a mask. With various implementations of the invention, the operation 603 may perform multiple iterations of optical proximity correction on the portion of a layout design for a mask. Still, in various implementations of the invention, the operations 603 may perform the lithographic simulation and edge fragment displacement determinations of optical proximity correction, while the edge fragment displacement is carried out by another operation. For example, FIG. 6A illustrates the method 601 including an additional operation 609 for displacing selected edge fragments. More particularly, the operations 609 may displace ones of the edge fragments not disabled by the operation 605.

As stated above, the method 601 includes an operation 605 for disabling selected edge fragments. In various implementations of the invention, a disabled edge fragment is ignored by the optical proximity correction process. More particularly, the lithographic simulations, the edge fragment displacement determinations, and the displacement of edge fragments is not performed for the disabled edge fragments. For example, in subsequent iterations of the method 601, the operation 603 may ignore the disabled edge fragments during the performance of optical proximity correction.

Site Selective Optical Proximity Correction Simulation

Figure 7:
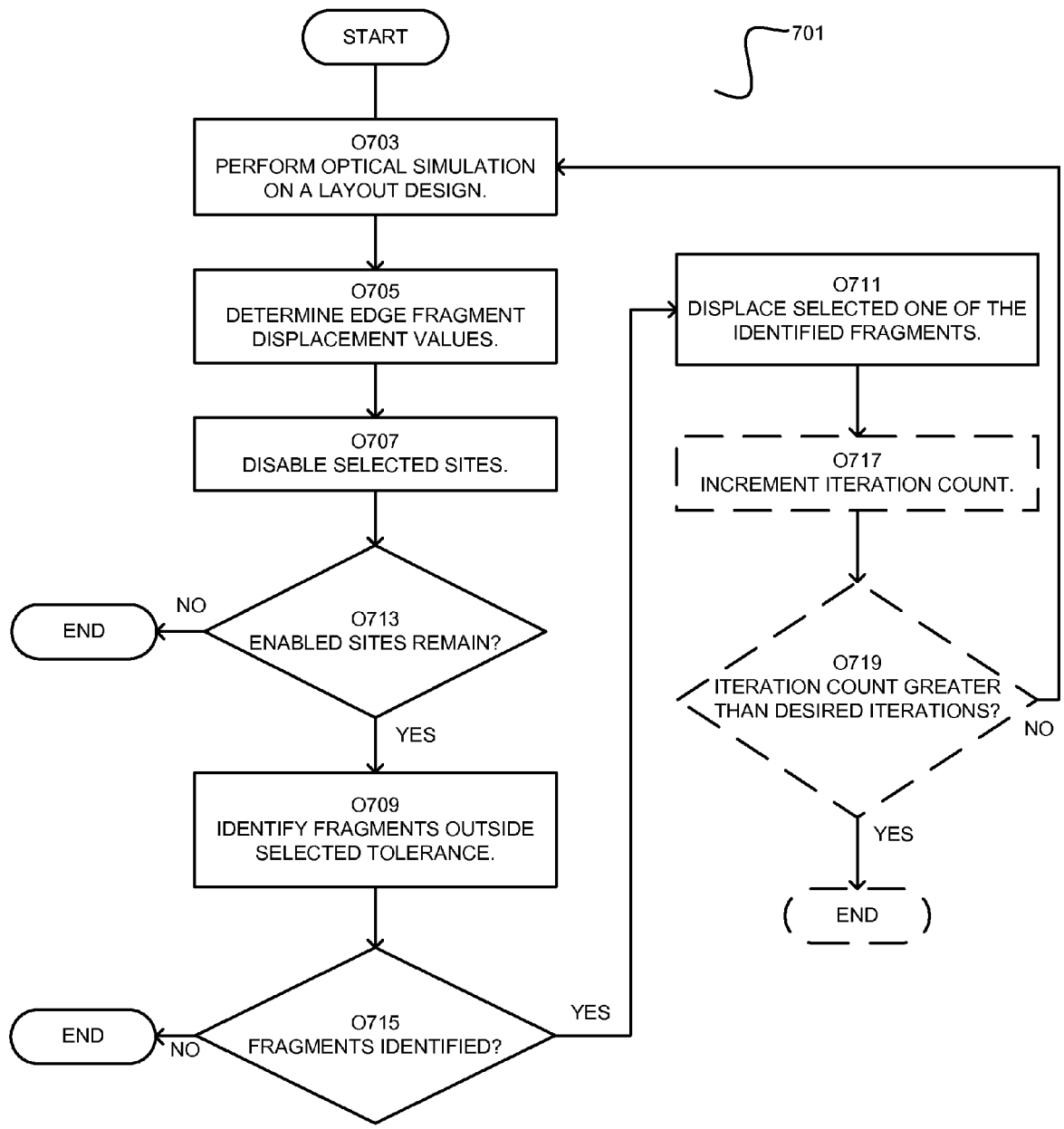
FIG. 7 illustrates a method of modifying a layout design.

The operation 603, the operation 605, the operation 607, and the operation 609 of the method 601 may be performed by multiple sub-operations. For example, FIG. 7 illustrates a method 701 that may be implemented according to various embodiment of the present invention. In various implementations of the invention, operations of the method 701 may correspond to operations of the method 601 illustrated in FIG. 6 and FIG. 6A. As can be seen in FIG. 7, the method 701 includes an operation 703 for performing a lithographic simulation of a layout design. With various implementations of the invention, the lithographic simulation is a model based simulation. With various further implementations of the invention, an optical model based simulation is employed by the operation 703. In various other implementations of the invention, a resist model based simulation is employed by the operation 703. Further still, with various implementations of the invention, an optical and resist model based simulation is employed by the operation 703.

Alternatively, in various implementations of the invention, the lithographic simulation is a rule based simulation. With various further implementations of the invention, an optical rule based simulation is employed by the operation 703. In various other implementations of the invention, a resist rule based simulation is employed by the operation 703. Further still, with various implementations of the invention, an optical and resist rule based simulation is employed by the operation 703.

Figure 8:
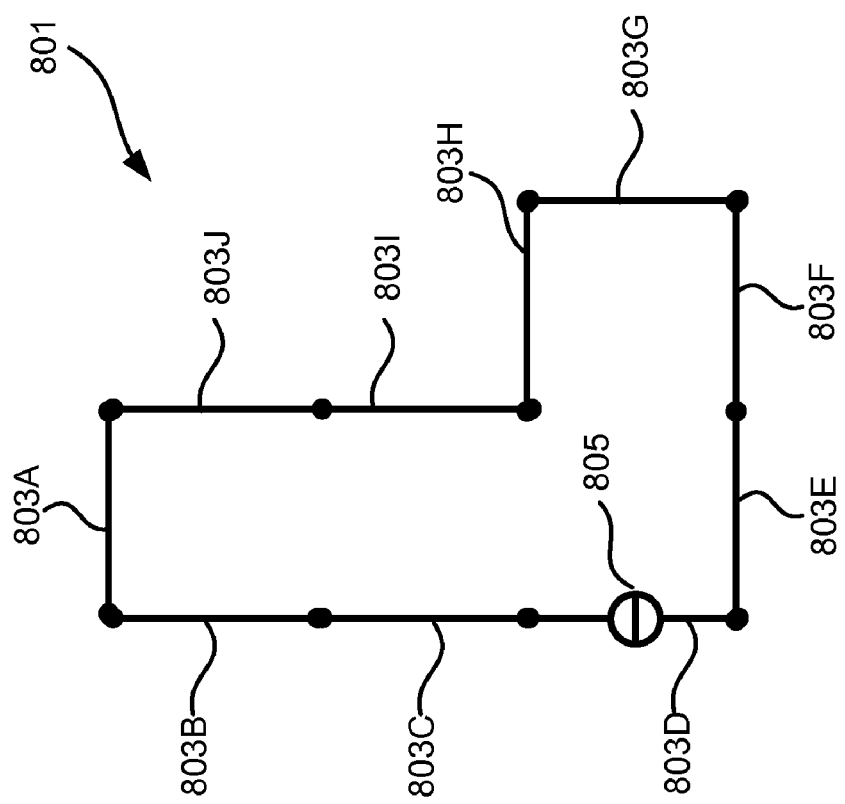
FIG. 8 illustrates a layout design feature.

As stated, the operation 703 simulates the lithographic process. In a typical optical proximity correction process, the lithographic process is simulated at selected locations or "sites" within the layout design. Accordingly, as used herein a site is the location or locations within the layout design wherein lithographic simulations take place and is hereafter referred to interchangeably as a simulation site or a site. For example, FIG. 8 illustrates a design feature 801. As can be seen from FIG. 8, the design feature 801 has been partitioned into edge fragments 803A-803J. In various implementations of the invention, a simulation site is placed at the midpoint of each edge fragment, such as the simulation site 805. With various implementations of the invention, each edge fragment has a corresponding simulation site. With alternative implementations of the invention, only selected edge fragments have a corresponding simulation site. Still, with various implementations of the invention, the simulation sites are dynamically determined during the operation 803. For example, with various further implementations of the invention, the simulation site locations may be determined based upon the type of feature or edge fragment near the simulation site.

Edge Fragment Displacement Determination

Returning to FIG. 7, the method 701 further includes an operation 705 for determining the edge fragment displacement values. In various implementations of the invention, an array is employed to track the edge fragment displacement values.

Let an array L equal the edge fragment displacement values. Accordingly, L[i] equals the edge fragment displacement value for the edge fragment i. With various implementations of the invention, L equals $R_0/8$. Where $$R_0 = \frac{\lambda}{NA},$$

often referred to as the optical resolution of the simulated lithographic process. As can be seen, the optical resolution, as defined by $R_O$, depends upon $\lambda$, which is the wavelength of light employed in the lithographic process, and NA, which is the numerical aperture of the lithographic system. As the wavelength and numerical aperture do not change throughout the lithographic process, $R_O$ is typically held constant through the optical proximity correction process. With still various implementations of the invention, the initial value of L equals $R_O/8$ and the operation 705 computes the value of L according to Equation [1]. The variables and various implementations employing Equation [1] are discussed in further detail below.

$$d\alpha = \frac{-me}{1 + m|c|/L} \quad [1]$$

Figure 9:
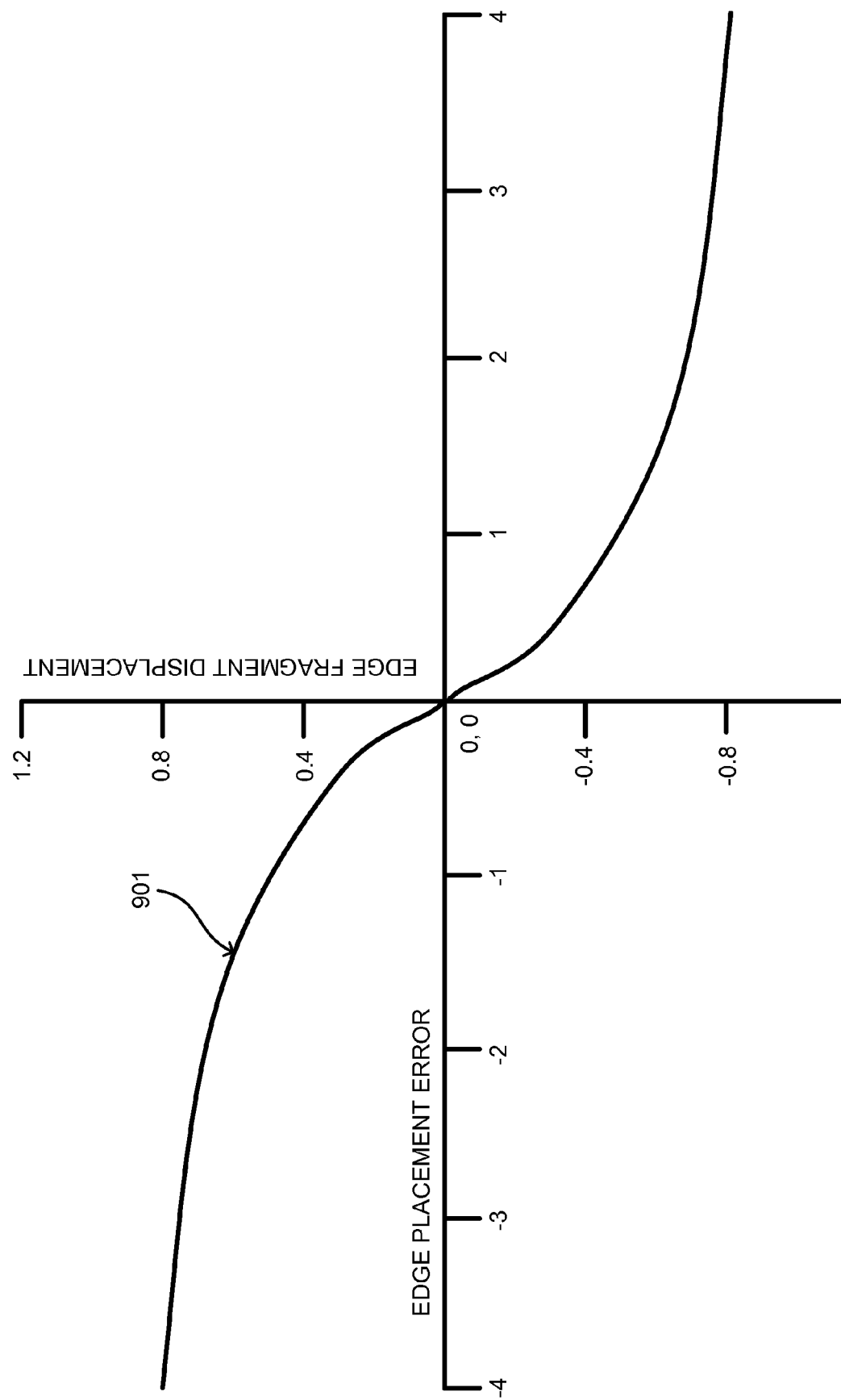
FIG. 9 illustrates a plot correlating edge fragment displacement to edge placement error.

As can be seen from Equation [1], the edge fragment displacement values may be determined by solving for L. The variable m in Equation [1] is the slope of the edge segment displacement value relative to the edge placement error. For example, FIG. 9 illustrates a plot 901, which represents Equation [1] with m=1. As can be seen in FIG. 9, the plot 901 depicts edge fragment displacement values according to Equation [1] for a given edge placement error.

As described above, edge fragments are displaced during an optical proximity correction process. As further described above, an edge fragments displacement will often oscillate around a solution for a number of iterations prior to converging upon a suitable solution. It follows that the computed edge fragments displacements oscillate between overshooting and undershooting the edge fragment displacement corresponding to a suitable solution. Accordingly, there is a value $\alpha$, which when combined with an initial edge fragment displacement $p_0$, produces an edge fragment displacement $p_1$ that has an edge placement error of zero. Referring again to Equation [1], $d\alpha$ is the edge segment displacement value that results in an edge placement error of zero. In various implementations of the invention, a relationship between $p_0$ and $p_1$ is assumed to be linear. Accordingly, one may describe the relationship between the initial and subsequent edge fragment displacements as $p(\alpha)=p_0+\alpha(p_1-p_0)$.

Disabling Selected Edge Fragments

Returning again to FIG. 7, the method 701 further includes an operation 707 for disabling selected "sites." In various implementations of the invention, the selected sites are simulation sites, such as the simulation site 805 illustrated in FIG. 8. The sites disabled by the operation 707 are hereafter referred to as disabled, hidden, or locked simulation sites interchangeably. With various implementations of the invention, lithographic simulations may not be performed by the operation 703 at hidden simulation sites. Accordingly, edge fragment displacements may not be determined by the operation 705 for edge fragments corresponding to the hidden simulation sites. In various implementations of the invention, a simulation site is hidden by removing the simulation site from the list of available simulation sites. With other implementations of the invention, a simulation site is hidden by locking or turning off adjustments to the simulation sites corresponding edge fragment.

As stated, the operation 707 disables selected simulation sites. In various implementations of the invention, sites determined to be "stable" are selected by the operation 707 and disabled. In further implementations of the invention, a stable simulation site is one in which future displacement adjustments to the simulation sites corresponding edge fragment are unlikely to improve the printed image. For example, a simulation site may be determined stable if the simulated printed image at the simulation site is within a selected tolerance of the target image. More particularly, a site may be determined stable if the simulated printed image at the site is within a predetermined edge placement error tolerance of the target image.

In various implementations of the invention, a site may be determined stable if the displacement of the sites corresponding edge fragment was not adjusted during the previous iteration. With other various implementations of the invention, a site may be considered stable if the displacement of the sites corresponding edge fragment was not adjusted during a selected number of previous iterations. Still, with various implementations of the invention, a site may be considered stable if the displacement of the sites corresponding edge fragment was not adjusted during a selected number of consecutive prior iterations. Further still, with various implementations of the invention a site may be determined as stable if either the printed image at the site is within a predetermined edge placement error tolerance or the displacement of the sites corresponding edge fragment was not adjusted during a selected number of consecutive prior iterations.

In a typical optical proximity correction process, hundreds, even thousands of edge fragments may be displaced during a single iteration. Additionally, the movement of a selected edge fragment will often have an affect upon the printed image at adjacent or "neighbor" edge fragments. This relationship between neighboring edge fragments affects the stability of a given edge fragment. Accordingly, in various implementations of the invention, an edge fragment will be determined as stable only if the edge fragment and its neighbor edge fragments are determined as stable.

With various implementations of the invention, an edge fragment will be considered stable only if the edge fragment and a selected number of its neighbor edge fragments are considered stable. In various implementations of the invention, edge fragments may be considered to be neighbors if they are within a predetermined distance from each other. With various implementations of the invention, edge fragments may be considered to be neighbors if their centers are within a predetermined distance from each other. Still, with various further implementations of the invention, an edge fragment is restricted in how many "neighbors" it may have. Accordingly, in various implementations of the invention, an edge fragments neighbors are the closest edge fragments within a predetermined distance. As a result, it is possible that with various implementations of the invention, a first edge fragment may be neighbors with a second edge fragments, but the second edge fragment will not be neighbors with the first edge fragment. Still, with various implementations of the invention, a selected edge fragments neighbors may be determined by a center to center Manhattan distance method.

Edge Fragment Adjustment

The method 701 further includes an operation 709 for identifying edge fragments that correspond to locations where the simulated printed image is outside a selected tolerance of the target printed image and an operation 711 for displacing selected ones of the identified edge fragments. Additionally, as can be seen from FIG. 7, the operation 709 is preceded by an operation 713 for determining is enabled sites remain, and the operation 711 is preceded by an operation 715 for determining if edge fragments were identified by the operation 709. In various implementations of the invention, the method 701 may end if all simulation sites within the design are disabled. Furthermore, with various implementations of the invention, the method 701 may end if the simulated printed image corresponding to all the edge fragments is within a selected tolerance of the target printed image. Accordingly, selected edge fragments may be displaced by the operation 711 if enabled edge fragments remain and if ones of the remaining edge fragments have an edge placement error greater than a threshold value.

In various implementations of the invention, the operation 711 for displacing selected ones of the identified edge fragments displaces the selected edge fragments according to Equation [1] discussed above. For example, the edge fragments displacements computed by the operation 705 above may be used to displace the selected edge fragments by the operation 711.

Subsequent Iterations of Site Selective Optical Proximity Correction

As can be further seen from FIG. 7, the method 701 optionally includes an operation 717 for incrementing an iteration count and an operation 719 for determining if the iteration count is greater than a desired number of iterations. Those of skill in the art will appreciate that the operation 717 and the operation 719 may be employed to control the number of iteration with which to perform the method 701. For example, if a maximum of 5 iterations is desired, then the operation 719 may end the method after the operation 717 has incremented the iteration count 5 times.

As stated above, optical proximity correction often takes multiple iterations to converge upon a suitable solution. Additionally, depending upon the optical proximity correction process and the associated recipe, the process may oscillate around a suitable solution for a long period of time, or not converge upon a suitable solution at all. Accordingly, it is often desirable to specify the maximum number of iterations for which optical proximity correction is desired.

Site Selective Optical Proximity Correction Tool

Figure 10:
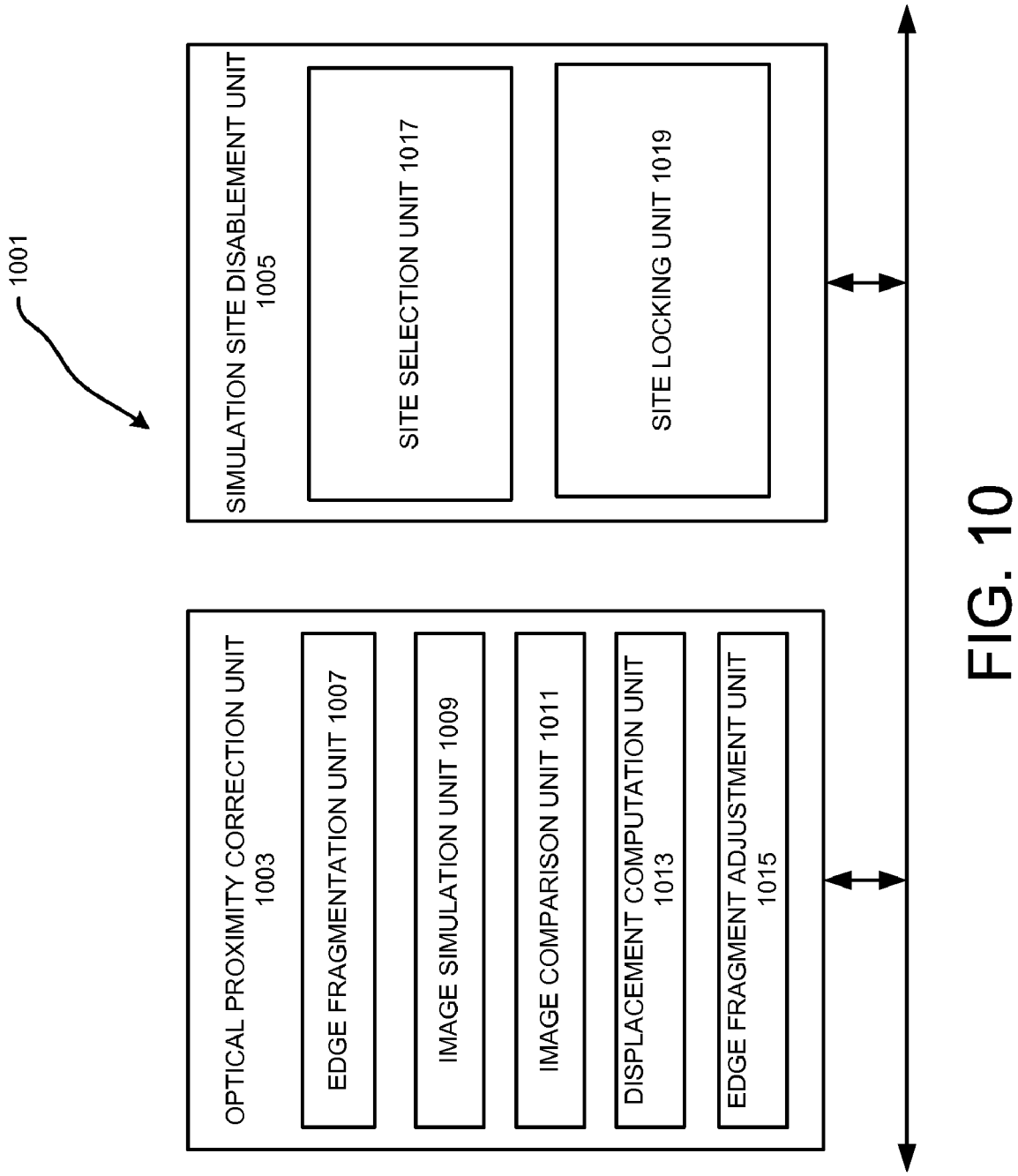
FIG. 10 illustrates a site selective optical proximity correction tool.

FIG. 10 illustrates a site selective optical proximity correction tool 1001, which may be implemented according to various embodiments of the present invention to adjust a layout design or a mask. For example, the tool 1001 may be employed to perform the method 601 shown in FIG. 6 or 6A, as well as the method 701 shown in FIG. 7. As can be seen from FIG. 10, the tool 1001 includes an optical proximity correction unit 1003 and a simulation site disablement unit 1005. The tool 1001 may be implemented by, for example, executable software instructions embodied in a computer-readable medium or by a computer executing software instructions for performing the functions of the tool 1001.

With some implementations of the invention, the optical proximity correction unit 1003 is a conventional optical proximity tool. For example, embodiments of the present invention may be implemented in conjunction with the Calibre optical proximity correction tools by Mentor Graphics Corporation of Wilsonville, Oreg. In other implementation of the invention, the optical proximity correction tool 1003 is one designed specifically for use by the site selective optical proximity correction tool 1001. As seen in FIG. 10, the optical proximity correction unit 1003 includes an edge fragmentation unit 1007, an image simulation unit 1009, an image comparison unit 1011, an edge fragment displacement computation unit 1013, and an edge fragment adjustment unit 1015. The units 1007-1015 of the optical proximity correction unit 1003 provide the functionality needed for a layout design to be iteratively adjusted by an optical proximity correction process as discussed above. Those of skill in the art will appreciate that various tools exist for performing optical proximity correction, and the unit 1003 is but one implementation of them.

As stated above, with some implementations of the invention a tool such as the site selective optical proximity correction tool 1001 may be employed to perform the method 601 detailed in FIG. 6A. Accordingly, with various implementations of the invention, the optical proximity correction unit 1003 may be employed to perform the operations 603 and 609, while the simulation site disablement unit 1005 may be employed to perform the operation 605.

Conclusion

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

Methods and apparatuses for altering a portion of a layout design have been shown. More particularly, techniques for reducing the time required for an optical proximity correction process to converge upon a suitable solution have been disclosed. In some implementations, edge fragments and/or simulation sites are monitored during the optical proximity correction process. Selected ones of the edge fragments and/or simulation sites are "disabled" for further iterations of the optical proximity correction process. More particularly, simulations, displacement calculations and layout adjustments may not be performed on these "disabled" sites.

In some implementations, a select number of iterations of the optical proximity correction process are performed upon the layout design prior to selected edge fragments and/or simulation sites being "disabled."

What is claimed is:

1. A computer implemented method comprising:
    implementing one or more iterations of a first optical proximity correction process on a computer, wherein the first optical proximity correction process alters a portion of a layout design for an integrated circuit having a plurality of edge segments, by deriving a displacement value relative to a reference location for selected edge segments and adjusting the location of the selected edge segments based upon the derived displacement values;
    classifying selected ones of the plurality of edge segments as stable based in part upon the derived displacement values; and
    implementing one or more iterations of a second optical proximity correction process on a computer, wherein the second optical proximity correction process alters the portion of the layout design for the integrated circuit, by deriving a displacement value relative to a reference location for selected edge segments not classified as stable and adjusting the location of the selected edge segments based upon the derived displacement values.

2. The method recited in claim 1, further comprising:
    classifying selected ones of the plurality of edge segments as stable based in part upon the derived displacement values from the second optical proximity correction process; and
    implementing one or more iterations of a third optical proximity correction process on a computer, wherein the third optical proximity correction process alters the portion of the layout design for the integrated circuit, by deriving a displacement value relative to a reference location for selected edge segments not classified as stable and adjusting the location of the selected edge segments based upon the derived displacement values.

3. The computer implemented method recited in claim 2, wherein the optical proximity correction process simulates an optical lithographic process and the displacement values are derived based in part upon the size of the numerical aperture of the optical lithographic process, the wavelength of light employed in the optical lithographic process, and an edge placement error value.

4. The computer implemented method recited in claim 3, wherein ones of the derived displacement values oscillate around the displacement value that would produce an edge placement error of zero during the optical lithographic process simulation and wherein ones of the plurality of edge fragments are classified as stable if the oscillation is within a threshold level.

5. The computer implemented method recited in claim 3, wherein edge ones of the plurality of edge fragments are classified as stable if the edge placement error is less than a threshold value.

6. The computer implemented method recited in claim 3, wherein ones of the plurality of edge segments are classified as stable if the derived displacement value is less than a threshold value.

7. The computer implemented method recited in claim 3, wherein ones of the plurality of edge segments are classified as stable if the edge segment is within a specified distance from another edge segment that has been classified as stable.

8. A computer program product comprising:
software instructions for enabling a computer to perform a set of predetermined operations; and
a computer storage device having the software instructions stored therein;
the set of predetermined operations including:
implementing one or more iterations of a first optical proximity correction process on a computer, wherein the first optical proximity correction process alters a portion of a layout design for an integrated circuit having a plurality of edge segments, by deriving a displacement value relative to a reference location for selected edge segments and adjusting the location of the selected edge segments based upon the derived displacement values;
classifying selected ones of the plurality of edge segments as stable based in part upon the derived displacement values;
implementing one or more iterations of a second optical proximity correction process on a computer, wherein the second optical proximity correction process alters the portion of the layout design for the integrated circuit, by deriving a displacement value relative to a reference location for selected edge segments not classified as stable and adjusting the location of the selected edge segments based upon the derived displacement values; and
storing the altered portion of the layout design to a memory storage location.

9. The computer program product recited in claim 8, wherein the set of operations further comprises:
classifying selected ones of the plurality of edge segments as stable based in part upon the derived displacement values from the second optical proximity correction process; and
implementing one or more iterations of a third optical proximity correction process on a computer, wherein the third optical proximity correction process alters the portion of the layout design for the integrated circuit, by deriving a displacement value relative to a reference location for selected edge segments not classified as stable and adjusting the location of the selected edge segments based upon the derived displacement values.

* * * * *